US012796169B2

(12) United States Patent
Armitage

(10) Patent No.: US 12,796,169 B2
(45) Date of Patent: Nov. 10, 2026

(54) RED LED WITH LOW FORWARD VOLTAGE, HIGH WALL PLUG EFFICIENCY, AND HIGH OPERATING CURRENT DENSITY

(71) Applicant: Lumileds LLC, San Jose, CA (US)

(72) Inventor: Robert Armitage, Cupertino, CA (US)

(73) Assignee: LUMILEDS SINGAPORE PTE. LTD., Singapore (SG)

( * ) Notice: Subject to any disclaimer, the term of this patent is extended or adjusted under 35 U.S.C. 154(b) by 457 days.

(21) Appl. No.: 18/280,975

(22) PCT Filed: Mar. 16, 2022

(86) PCT No.: PCT/US2022/020505
§ 371 (c)(1),
(2) Date: Sep. 8, 2023

(87) PCT Pub. No.: WO2022/203914
PCT Pub. Date: Sep. 29, 2022

(65) Prior Publication Data

US 2024/0297267 A1 Sep. 5, 2024

Related U.S. Application Data

(60) Provisional application No. 63/146,119, filed on Mar. 22, 2021.

(51) Int. Cl.
*H10H 20/812* (2025.01)
*H10H 20/824* (2025.01)

(52) U.S. Cl.
CPC ...... *H10H 20/812* (2025.01); *H10H 20/8242* (2025.01)

(58) Field of Classification Search
CPC ............. H10H 20/812; H10H 20/8242; H10H 20/811
See application file for complete search history.

(56) References Cited

U.S. PATENT DOCUMENTS 6,140,157 A * 10/2000 Warren .................. G11C 11/22 438/149
6,410,942 B1 6/2002 Thibeault et al.
(Continued)

FOREIGN PATENT DOCUMENTS

DE 102010051286 A1 5/2012
DE 102012109460 A1 4/2014
(Continued)

OTHER PUBLICATIONS

Dussaigne, A., et al., "Full InGaN red light emitting diodes", J. Appl. Phys. 128, 135704 (2020); https://doi.org/10.1063/5.0016217.

(Continued)

*Primary Examiner* — Mark W Tornow
(74) *Attorney, Agent, or Firm* — Servilla Whitney LLC

(57) ABSTRACT

Described are light emitting diode (LED) devices including a quantum well comprising an indium gallium nitride (InGaN) well and a barrier layer. The indium gallium nitride (InGaN) well has an indium concentration greater than 18% mole fraction. The LED device has a dominant wavelength greater than 605 nm at a current density of greater than or equal to 2 A/cm$^2$.

18 Claims, 7 Drawing Sheets

(56) References Cited

U.S. PATENT DOCUMENTS

| | | | |
|---|---|---|---|
| 6,657,236 | B1 | 12/2003 | Thibeault et al. |
| 6,821,804 | B2 | 11/2004 | Thibeault et al. |
| 8,222,811 | B2 | 7/2012 | Vaufrey et al. |
| 8,258,044 | B2 | 9/2012 | Brun et al. |
| 8,487,340 | B2 | 7/2013 | Gilet et al. |
| 8,638,032 | B2 | 1/2014 | Maindron et al. |
| 8,647,957 | B2 | 2/2014 | Borowik et al. |
| 8,697,548 | B2 | 4/2014 | Borowik et al. |
| 8,698,396 | B2 | 4/2014 | Maindron et al. |
| 8,890,111 | B2 | 11/2014 | Templier et al. |
| 9,093,607 | B2 | 7/2015 | Gilet et al. |
| 9,109,296 | B2 | 8/2015 | Metaye et al. |
| 9,112,112 | B2 | 8/2015 | Do et al. |
| 9,192,290 | B2 | 11/2015 | Spinnler et al. |
| 9,209,366 | B2 | 12/2015 | Maindron et al. |
| 9,263,633 | B2 | 2/2016 | Gilet et al. |
| 9,396,970 | B2 | 7/2016 | Gillot et al. |
| 9,422,628 | B2 | 8/2016 | Simonato et al. |
| 9,496,465 | B2 | 11/2016 | Sugimoto et al. |
| 9,507,204 | B2 | 11/2016 | Pelka et al. |
| 9,601,542 | B2 | 3/2017 | Robin et al. |
| 9,722,160 | B2 | 8/2017 | Nakabayashi |
| 9,768,350 | B2 | 9/2017 | Bavencove et al. |
| 9,887,184 | B2 | 2/2018 | Takeya et al. |
| 9,945,526 | B2 | 4/2018 | Singer et al. |
| 9,978,727 | B2 | 5/2018 | Takeya et al. |
| 9,997,688 | B2 | 6/2018 | Takeya et al. |
| 10,002,928 | B1 | 6/2018 | Raring et al. |
| 10,018,325 | B2 | 7/2018 | Kim et al. |
| 10,050,026 | B2 | 8/2018 | Takeya et al. |
| 10,068,884 | B2 | 9/2018 | Takeya et al. |
| 10,145,518 | B2 | 12/2018 | Do et al. |
| 10,361,341 | B2 | 7/2019 | Danesh et al. |
| 10,964,845 | B2 | 3/2021 | Dimitropoulos et al. |
| 2003/0136333 | A1* | 7/2003 | Semond .................. C30B 23/02 257/E21.127 |
| 2011/0151607 | A1 | 6/2011 | Landis et al. |
| 2011/0287606 | A1 | 11/2011 | Brun et al. |
| 2012/0205614 | A1 | 8/2012 | Templier et al. |
| 2013/0020115 | A1 | 1/2013 | Mataye et al. |
| 2013/0112945 | A1 | 5/2013 | Gilet et al. |
| 2014/0077156 | A1 | 3/2014 | Bavencove et al. |
| 2014/0094878 | A1 | 4/2014 | Gossler et al. |
| 2014/0138719 | A1 | 5/2014 | Maindron et al. |
| 2015/0118544 | A1 | 4/2015 | Oukassi |
| 2015/0144590 | A1 | 5/2015 | Simonato et al. |
| 2015/0228873 | A1 | 8/2015 | Gebuhr et al. |
| 2015/0255673 | A1 | 9/2015 | Kaisha |
| 2015/0280060 | A1 | 10/2015 | Gilet et al. |
| 2015/0380461 | A1 | 12/2015 | Robin et al. |
| 2016/0079565 | A1 | 3/2016 | Maindron et al. |
| 2016/0190400 | A1 | 6/2016 | Jung et al. |
| 2016/0218240 | A1 | 7/2016 | Bouvier et al. |
| 2016/0293811 | A1 | 10/2016 | Hussell et al. |
| 2017/0080457 | A1 | 3/2017 | Eymery et al. |
| 2017/0098746 | A1 | 4/2017 | Bergmann et al. |
| 2017/0137645 | A1 | 5/2017 | Manceau et al. |
| 2017/0186612 | A1 | 6/2017 | Almadori et al. |
| 2017/0243860 | A1 | 8/2017 | Hong et al. |
| 2017/0293065 | A1 | 10/2017 | Kim |
| 2017/0358563 | A1 | 12/2017 | Cho et al. |
| 2017/0358724 | A1 | 12/2017 | Shichijo et al. |
| 2018/0017939 | A1 | 1/2018 | Allier et al. |
| 2018/0019369 | A1 | 1/2018 | Cho et al. |
| 2018/0019373 | A1 | 1/2018 | Lehnhardt et al. |
| 2018/0061316 | A1 | 3/2018 | Shin et al. |
| 2018/0074372 | A1 | 3/2018 | Takeya et al. |
| 2018/0090540 | A1 | 3/2018 | Von Malm et al. |
| 2018/0138157 | A1 | 5/2018 | Im et al. |
| 2018/0145059 | A1 | 5/2018 | Welch et al. |
| 2018/0149328 | A1 | 5/2018 | Cho et al. |
| 2018/0156406 | A1 | 6/2018 | Feil et al. |
| 2018/0166470 | A1 | 6/2018 | Chae |
| 2018/0174519 | A1 | 6/2018 | Kim et al. |
| 2018/0174931 | A1 | 6/2018 | Henley |
| 2018/0210282 | A1 | 7/2018 | Song et al. |
| 2018/0238511 | A1 | 8/2018 | Hartmann et al. |
| 2018/0259137 | A1 | 9/2018 | Lee et al. |
| 2018/0259570 | A1 | 9/2018 | Henley |
| 2018/0272605 | A1 | 9/2018 | Gmeinsieser et al. |
| 2018/0283642 | A1 | 10/2018 | Liao et al. |
| 2018/0297510 | A1 | 10/2018 | Fiederling et al. |
| 2018/0339643 | A1 | 11/2018 | Kim |
| 2018/0339644 | A1 | 11/2018 | Kim |
| 2018/0354406 | A1 | 12/2018 | Park |
| 2022/0209066 | A1* | 6/2022 | Tan .................. H10H 20/01335 |
| 2024/0063340 | A1* | 2/2024 | Keller .................. H10H 29/142 |

FOREIGN PATENT DOCUMENTS

| | | | |
|---|---|---|---|
| DE | 102014112551 | A1 | 3/2016 |
| EP | 1378949 | A1 | 1/2004 |
| EP | 2027608 | A1 | 2/2009 |
| EP | 2203939 | A1 | 7/2010 |
| EP | 2211387 | A2 | 7/2010 |
| EP | 2339658 | A2 | 6/2011 |
| EP | 2491591 | A1 | 8/2012 |
| EP | 2499958 | A1 | 9/2012 |
| EP | 2521161 | A1 | 11/2012 |
| EP | 2521162 | A1 | 11/2012 |
| EP | 2553149 | A1 | 2/2013 |
| EP | 2617069 | A1 | 7/2013 |
| EP | 2674516 | A1 | 12/2013 |
| EP | 2855744 | B1 | 5/2016 |
| EP | 3053199 | A1 | 8/2016 |
| EP | 3144272 | A1 | 3/2017 |
| EP | 2006921 | B1 | 12/2018 |
| EP | 3410002 | A1 | 12/2018 |
| EP | 3410003 | A1 | 12/2018 |
| EP | 2710634 | B1 | 10/2020 |
| FR | 2952366 | A1 | 5/2011 |
| FR | 2964796 | A1 | 3/2012 |
| FR | 2969995 | A1 | 7/2012 |
| FR | 2972815 | A1 | 9/2012 |
| FR | 2974940 | A1 | 11/2012 |
| FR | 2974941 | A1 | 11/2012 |
| FR | 2975532 | A1 | 11/2012 |
| FR | 2991342 | A1 | 12/2013 |
| FR | 2991999 | A1 | 12/2013 |
| FR | 2998090 | A1 | 5/2014 |
| FR | 3011383 | A1 | 4/2015 |
| FR | 3041274 | A1 | 3/2017 |
| FR | 3046155 | A1 | 6/2017 |
| FR | 3052915 | A1 | 12/2017 |
| JP | 2016066765 | A | 4/2016 |
| KR | 20140118466 | A | 10/2014 |
| KR | 20170018687 | A | 2/2017 |
| KR | 20180010670 | A | 1/2018 |
| KR | 20180114413 | A | 10/2018 |
| TW | 201417339 | A | 5/2014 |
| TW | 201620163 | A | 6/2016 |
| WO | 2006138465 | A2 | 12/2006 |
| WO | 2011045289 | A1 | 4/2011 |
| WO | 2011048318 | A1 | 4/2011 |
| WO | 2012035243 | A1 | 3/2012 |
| WO | 2012156620 | A2 | 11/2012 |
| WO | 2013182969 | A1 | 12/2013 |
| WO | 2015044620 | A1 | 4/2015 |
| WO | 2016079505 | A1 | 5/2016 |
| WO | 2017068029 | A1 | 4/2017 |
| WO | 2017102708 | A1 | 6/2017 |
| WO | 2017184686 | A1 | 10/2017 |
| WO | 2017216445 | A1 | 12/2017 |
| WO | 2018091657 | A1 | 5/2018 |
| WO | 2018139866 | A1 | 8/2018 |
| WO | 2018143682 | A1 | 8/2018 |
| WO | 2018159977 | A1 | 9/2018 |
| WO | 2018169243 | A1 | 9/2018 |
| WO | 2019092357 | A1 | 5/2019 |

(56) References Cited

FOREIGN PATENT DOCUMENTS

| | | | |
|---|---|---|---|
| WO | 2019126539 | A1 | 6/2019 |
| WO | 2021050731 | A1 | 3/2021 |

OTHER PUBLICATIONS

Hwang, Jong-Il, et al., “Development of InGaN-based red LED grown on (0001) polar surface”, Applied Physics Express 7, 071003 (2014).
Zhang, Shengnan, “Efficient Emission of InGaN-Based Light-Emitting Diodes: Toward Orange and Red”, vol. 8, No. 11, Nov. 2020, Photonics Research.
Zhou, Shengjun, et al., “Reverse leakage current characteristics of InGaN/GaN multiple quantum well ultraviolet/blue/green light-emitting diodes”, Japanese Journal of Applied Physics 57, 051003 (2018).

* cited by examiner

RED LED WITH LOW FORWARD VOLTAGE, HIGH WALL PLUG EFFICIENCY, AND HIGH OPERATING CURRENT DENSITY

CROSS-REFERENCE TO RELATED APPLICATIONS

This application is a National Phase entry of United States PCT Application No. PCT/US2022/020505, filed Mar. 16, 2022, which claims priority to U.S. Provisional Patent Application No. 63/164,119, filed Mar. 22, 2021, the disclosures of which are incorporated herein by reference in their entireties.

TECHNICAL FIELD

Embodiments of the disclosure generally relate to arrays of light emitting diode (LED) devices and methods of manufacturing the same. More particularly, embodiments are directed to light emitting diode devices, specifically an LED that maintains a true red wavelength, a high wall plug efficiency, and low forward voltage at current densities greater than 2 A/cm$^2$.

BACKGROUND

A light emitting diode (LED) is a semiconductor light source that emits visible light when current flows through it. LEDs combine a P-type semiconductor with an N-type semiconductor. LEDs commonly use a III-group compound semiconductor. A III-group compound semiconductor provides stable operation at a higher temperature than devices that use other semiconductors. The III-group compound is typically formed on a substrate formed of sapphire or silicon carbide (SIC).

Red-emitting InGaN LEDs are of interest for microLED display applications. Although the InGaN materials system suffers from decreasing internal quantum efficiency at longer wavelengths it has the advantage of being relatively insensitive to surface recombination. Due to their high sensitivity to non-radiative surface recombination, there is evidence that LEDs built from the AlInGaP materials system underperform InGaN red LEDs in the regime of smaller LED dimensions (<10 microns) and lower operating current densities. Aside from potential advantages in red microLED efficiency, it is desirable to use InGaN (rather than AlInGaP) for the red emitters in displays to facilitate integration with green and blue emitters which are necessarily based on the InGaN materials system.

Current InGaN red epitaxy does not meet the performance criteria for microLED display applications. Two general challenges of the InGaN materials system are that the emission spectrum has a broad full-width half maximum (FWHM), and that the wavelength shifts to much shorter wavelength as the injected current density increases. Displays with high color quality require a true red emitter characterized by a dominant wavelength of 610 nm or longer. Due to the broad FWHM, the dominant wavelength of current red InGaN LEDs is at least 10 nm shorter than the peak wavelength. High efficiency "red" LEDs have emission spectra acceptable for displays only when the LED is operated at sufficiently low current density.

Accordingly, there is a need for improved LED devices which maintain a red wavelength over wider ranges of operating current density.

SUMMARY

Embodiments of the disclosure are directed to LED devices and methods for manufacturing LED devices. In one or more embodiments, a light emitting diode (LED) device comprises: a quantum well comprising an indium gallium nitride (InGaN) well and a barrier layer, the indium gallium nitride (InGaN) well having an indium concentration greater than 18% mole fraction, the device having a dominant wavelength greater than 605 nm at a current density of greater than or equal to 2 A/cm$^2$.

Other embodiments of the disclosure are directed to a light emitting diode (LED) system comprising: a light emitting diode (LED) array comprising: a nucleation layer on a substrate; an n-type layer on the nucleation layer; a quantum well on the n-type layer, the quantum well comprising an indium gallium nitride (InGaN) well and a gallium nitride (GaN) barrier layer, the indium gallium nitride (InGaN) well having an indium concentration greater than 18% mole fraction; and a plurality of p-type layers on the quantum well, the device having a dominant wavelength greater than 605 nm at a current density greater than or equal to 2 A/cm$^2$.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

To facilitate understanding, identical reference numerals have been used, where possible, to designate identical elements that are common to the figures. The figures are not drawn to scale. For example, the heights and widths of the mesas are not drawn to scale.

DETAILED DESCRIPTION

Figure 1:
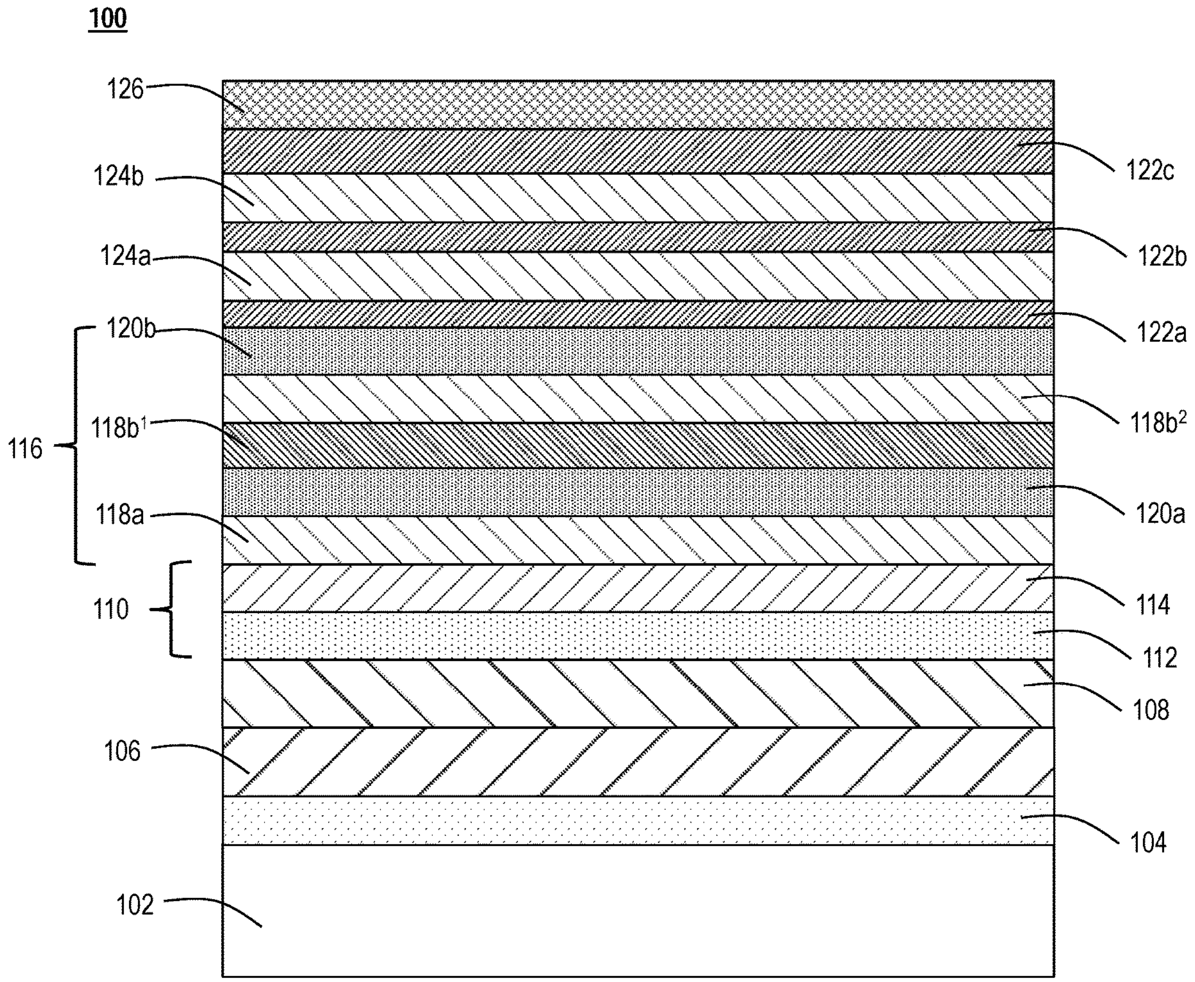
FIG. 1 illustrates a cross-sectional view of an LED device.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "substrate" as used herein according to one or more embodiments refers to a structure, intermediate or final, having a surface, or portion of a surface, upon which a process acts. In addition, reference to a substrate in some embodiments also refers to only a portion of the substrate, unless the context clearly indicates otherwise. Further, reference to depositing on a substrate according to some embodiments includes depositing on a bare substrate or on a substrate with one or more layers, films, features, or materials deposited or formed thereon.

In one or more embodiments, the "substrate" means any substrate or material surface formed on a substrate upon which film processing is performed during a fabrication process. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AlN, InN, and other alloys), metal alloys, and other conductive materials, depending on the application. Substrates include, without limitation, light emitting diode (LED) devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed is also performed on an underlayer formed on the substrate, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

The term "wafer" and "substrate" will be used interchangeably in the instant disclosure. Thus, as used herein, a wafer serves as the substrate for the formation of the LED devices described herein.

Embodiments described herein describe LED devices and methods for forming LED devices. In particular, the present disclosure describes LED devices and methods to produce LED devices which advantageously maintain a true red wavelength suitable for display application at a current density greater than or equal to 2 A/cm$^2$. In one or more embodiments, the epitaxy design has a low forward voltage, high wall plug efficiency, and small reverse leakage current. The improved process is readily manufacturable in one epitaxy step using standard substrates and mass production MOCVD equipment.

Not all microLEDs manufactured from a given wafer (or set of wafers) can realistically be expected to have equal external quantum efficiency (EQE) values in the as-fabricated state and/or after a display has been in use for some time. Since there is realistically some variation in EQE between different pixels, it may be required to operate some of the microLEDs at higher current densities than others in order to maintain a consistent surface radiance over the entire area of the display. An epitaxy design that exhibits a change in emission color from red to orange with only a moderate increase in current density may not be desirable for practical applications.

The embodiments of the disclosure are described by way of the Figures, which illustrate devices and processes for forming devices in accordance with one or more embodiments of the disclosure. The processes shown are merely illustrative possible uses for the disclosed processes, and the skilled artisan will recognize that the disclosed processes are not limited to the illustrated applications.

One or more embodiments of the disclosure are described with reference to the Figures. FIG. 1 illustrates a cross-sectional view of a device 100 according to one or more embodiments. An aspect of the disclosure pertains to a method of manufacturing a LED array. Referring to FIG. 1, a LED device 100 is manufactured having a dominant wavelength greater than 605 nm at a current density of greater than or equal to 2 A/cm$^2$. In some embodiments, the device has a reverse leakage current density less than 0.01 A/cm$^2$ at a bias of 15 V.

In one or more embodiments, a nucleation layer 104 and a defect reduction layer 106 are grown on a substrate 102, followed by an n-type layer 108. In some embodiments, a superlattice 110 comprised of alternating pairs of an indium gallium nitride (InGaN) layer 112 and a gallium nitride (GaN) layer 114 is grown over the n-type layer 108. In one or more embodiments, the superlattice 110 comprises a range of from 5 to 70 alternating pairs of an InGaN layer 112 and a GaN layer 114, or a range of from 10 to 50 alternating pairs of an InGaN layer 112 and a GaN layer 114. In one or more embodiments, the superlattice 110 comprises 40 pairs alternating pairs of an InGaN layer 112 and a GaN layer 114.

Figure 1A:
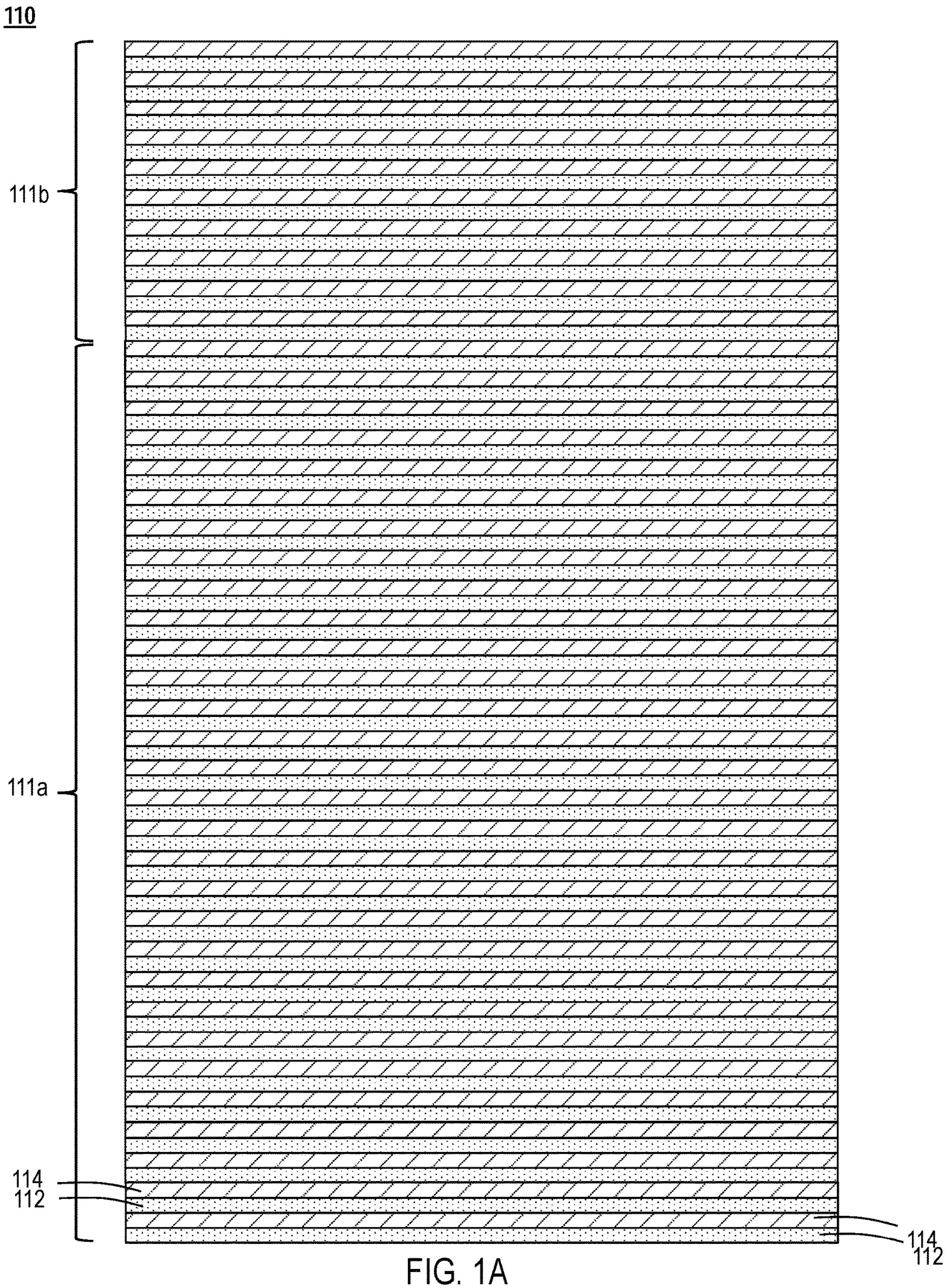
FIG. 1A illustrates a cross-sectional view of the superlattice structure of the LED device of FIG. 1.

FIG. 1A is an enlarged cross-section view of the superlattice 110. With reference to FIG. 1A, in some embodiments, the superlattice 110 comprises a first portion 111*a* and second portion 111*b* of alternating pairs of an indium gallium nitride (InGaN) layer 112 and a gallium nitride (GaN) layer 114. In one or more embodiments, the second portion 111*b* is on the first portion 111*a*. In some embodiments, the second portion 111*b* comprises the final 10 pairs of alternating pairs of an indium gallium nitride (InGaN) layer 112 and a gallium nitride (GaN) layer 114. In some embodiments, the first portion 111*a* can be doped with a first dopant. The first dopant may have a first dopant concentration in a range of from $1\times10^{18}$ cm$^{-3}$ to $5\times10^{18}$ cm$^{-3}$, including from $1\times10^{18}$ cm$^{-3}$ to $2\times10^{18}$ cm$^{-3}$. The InGaN layers in the first portion may have an indium concentration of less than 10% mole fraction. In some embodiments, the second portion 111*b* can be doped with a second dopant. The second dopant may have a second dopant concentration of less than $5\times10^{17}$ cm$^{-3}$. The InGaN layers in the second portion may have an indium concentration of less than 15% mole fraction. In one or more embodiments, the first dopant may be selected from one or more of silicon (Si), germanium (Ge), tin (Sn), and oxygen (O). In one or more embodiments, the second dopant may be selected from one or more of silicon (Si), germanium (Ge), tin (Sn), and oxygen (O).

The substrate 102 may be any substrate known to one of skill in the art which is configured for use in the formation of LED devices. In one or more embodiments, the substrate 102 comprises one or more of sapphire, silicon carbide, silicon (Si), quartz, magnesium oxide (MgO), zinc oxide (ZnO), spinel, and the like. In one or more embodiments, the substrate 102 is a transparent substrate. In specific embodiments, the substrate 102 comprises sapphire. In one or more embodiments, the substrate 102 is not patterned prior to formation of the LEDs. Thus, in some embodiments, the substrate is 102 not patterned and can be considered to be flat or substantially flat. In other embodiments, the substrate 102 is a patterned substrate.

In one or more embodiments, the n-type layer 108 may comprise any Group III-V semiconductors, including binary, ternary, and quaternary alloys of gallium (Ga), aluminum (Al), indium (In), and nitrogen (N), also referred to as III-nitride materials. Thus, in some embodiments, the n-type layer 108 comprises one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like. In a specific embodiment, the n-type layer 108 comprises gallium nitride (GaN). In one or more embodiments, the n-type layer 108 is doped with n-type dopants, such as silicon (Si) or germanium (Ge). The n-type layer 108 may have a dopant concentration significant enough to carry an electric current laterally through the layer. In some embodiments, the n-type layer 108 comprises a GaN contact layer.

In one or more embodiments, a nucleation layer 104 is formed on the substrate 102 prior to the defect reduction layer 106. In one or more embodiments, the nucleation layer comprises 104 a III-nitride material. In specific embodiments, the nucleation layer 104 comprises gallium nitride (GaN) or aluminum nitride (AlN).

In one or more embodiments, the layers of III-nitride material may be deposited by one or more of sputter deposition, atomic layer deposition (ALD), metalorganic chemical vapor deposition (MOCVD), molecular beam epitaxy (MBE), and hydride vapor phase epitaxy (HVPE).

"Sputter deposition" as used herein refers to a physical vapor deposition (PVD) method of thin film deposition by sputtering. In sputter deposition, a material, e.g., a III-nitride is ejected from a target that is a source onto a substrate. The technique is based on ion bombardment of a source material, the target. Ion bombardment results in a vapor due to a purely physical process, i.e., the sputtering of the target material.

As used herein according to some embodiments, "chemical vapor deposition" refers to a process in which films of materials are deposited from the vapor phase by decomposition of chemicals on a substrate surface. In CVD, a substrate surface is exposed to precursors and/or co-reagents simultaneous or substantially simultaneously. A particular subset of CVD processes commonly used in LED manufacturing use metalorganic precursor chemical and are referred to as MOCVD or metalorganic vapor phase epitaxy (MOVPE). As used herein, "substantially simultaneously" refers to either co-flow or where there is overlap for a majority of exposures of the precursors.

In one or more embodiments, LED device 100 is manufactured by placing the substrate 102 in a metalorganic vapor-phase epitaxy (MOVPE) reactor so that the LED device layers are grown epitaxially.

In one or more embodiments, a multi-quantum well 116 is formed on the superlattice 110. The multi-quantum well 116 comprises pairs of a quantum barrier layer 118 and a quantum well 120. The quantum barrier layer 118 may comprise any suitable material known to the skilled artisan. In some embodiments, the quantum barrier layer 118 comprises a gallium nitride (GaN) layer. The quantum well 120 may comprise any suitable material known to the skilled artisan. In some embodiments, the quantum well 120 comprises indium gallium nitride (InGaN) wells. In one or more embodiments, the quantum well 120 has an indium concentration greater than 18% mole fraction.

The multi-quantum well 116 may comprise different layers of indium gallium nitride (InGaN) and gallium nitride (GaN). The emission color may be controlled by the relative mole fractions of indium (In) and gallium (Ga) in the InGaN layer and/or by the thicknesses of the multiple quantum wells, and by the compositions of the barrier layers.

The multi-quantum well 116 may be formed using any deposition technique known to one of skill in the art. The multi-quantum well 116 may comprise a sequence of multiple quantum wells emitting the same wavelength of light. In one or more embodiments, the multi-quantum well 116 emits light having a wavelength in a range of from greater than 605 nm to 700 nm.

In one or more embodiments, an individual quantum well 120 within the multi-quantum well 116 may have an InGaN thickness in a range of from about 0.5 nm to about 10 nm. In some embodiments, the first quantum well 120*a* has a thickness in a range of from 3 nm to 4 nm. The total number of quantum wells in the multi-quantum well 116 may be in a range of from 1 to 30. In some embodiments, there are two quantum wells 120*a*, 120*b* in the multi-quantum well 116.

In some embodiments, the active region is comprised of two quantum wells 120*a*, 120*b*. In some embodiments, the quantum wells 120*a*, 120*b* comprise indium gallium nitride (InGaN) wells. In one or more embodiments, the quantum wells 120*a*, 120*b* have an indium concentration greater than 18% mole fraction.

In one or more embodiments, a first quantum barrier layer 118*a* is under the first quantum well 120*a*. In some embodiments, the first quantum barrier layer 118*a* comprises gallium nitride (GaN). The first quantum barrier layer 118*a* can have a thickness in a range of from 10 nm to 30 nm, or in a range of from 18 nm to 22 nm.

In one or more embodiments, the second quantum barrier layer 118*b* comprises a first layer 118*b*$^1$ and a second layer 118*b*$^2$ to form a bi-layer structure. In some embodiments, the first layer 118*b*$^1$ comprises a material selected from one or more of aluminum gallium nitride (AlGaN) and gallium nitride (GaN). In specific embodiments, the first layer 118*b*$^1$ comprises aluminum gallium nitride (AlGaN). The aluminum gallium nitride (AlGaN) may contain from 15% to 25% mole fraction of aluminum (Al). The first layer 118*b*$^1$ may have a thickness in a range of from 3 nm to 5 nm. In some embodiments, the second layer 118*b*$^2$ comprises a material selected from one or more of aluminum gallium nitride (AlGaN) and gallium nitride (GaN). In specific embodiments, the second layer 118*b*2 comprises gallium nitride (GaN). The second layer 118*b*$^2$ may have a thickness in a range of from 5 nm to 20 nm, or a range of from 15 nm to 18 nm.

In some embodiments, the quantum barrier layer 118 may be doped with a barrier dopant. The quantum barrier layer 118 may contain any suitable barrier dopant concentration.

In some embodiments, the quantum barrier layer 118 has a barrier dopant concentration in a range of from $5\times10^{17}$ $cm^{-3}$ to $5\times10^{18}$ $cm^{-3}$. The barrier dopant may be selected from one or more of silicon (Si), germanium (Ge), tin (Sn), and oxygen (O).

In one or more embodiments, a series of aluminum gallium nitride (AlGaN) layers 122*a*, 122*b*, 122*c* and gallium nitride (GaN) layers 124*a*, 124*b* are grown on the active region. In some embodiments, the aluminum gallium nitride layers 122*a*, 122*b*, 122*c* have a thickness in a range of from 1 nm to 10 nm. In some embodiments, as the distance away from the active region increases, the thickness of the aluminum gallium nitride layers 122*a*, 122*b*, 122*c* increases. The aluminum gallium nitride layers 124*a*, 124*b* may contain from 15% to 25% mole fraction of aluminum (Al). In some embodiments, the gallium nitride layers 124*a*, 124*b* have a thickness in a range of from 1 nm to 5 nm.

In one or more embodiments, a p-type layer 126 is grown over the aluminum gallium nitride (AlGaN) layer 122*c*. In one or more embodiments, the p-type layer 126 may comprise any Group III-V semiconductors, including binary, ternary, and quaternary alloys of gallium (Ga), aluminum (Al), indium (In), and nitrogen (N), also referred to as III-nitride materials. Thus, in some embodiments, the p-type layer 126 comprises one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like.

In some embodiments, the p-type layer 126 comprises a doped p-type layers. The p-type layer 126 may be doped with any suitable p-type dopant known to the skilled artisan. In one or more embodiments, the p-type layer 126 may be doped with magnesium (Mg). In one or more embodiments, the p-type layer 126 comprises a magnesium doped p-type gallium nitride layer.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Example 1

An LED having an indium gallium nitride (InGaN) well and a barrier layer was prepared. The indium gallium nitride (InGaN) well had an indium concentration greater than 18% mole fraction. The device had a dominant wavelength of 612 nm at a current density of 1.2 A/cm$^2$ and maintained a dominant wavelength greater than 605 nm at a current density of greater than or equal to 2 A/cm$^2$.

Comparative Example 2

An LED having an indium gallium nitride (InGaN) well and a barrier layer was prepared. The indium gallium nitride (InGaN) well had an indium concentration greater than 18% mole fraction. The device had a dominant wavelength of 610 nm at a current density of 1.2 A/cm$^2$.

Figure 2:
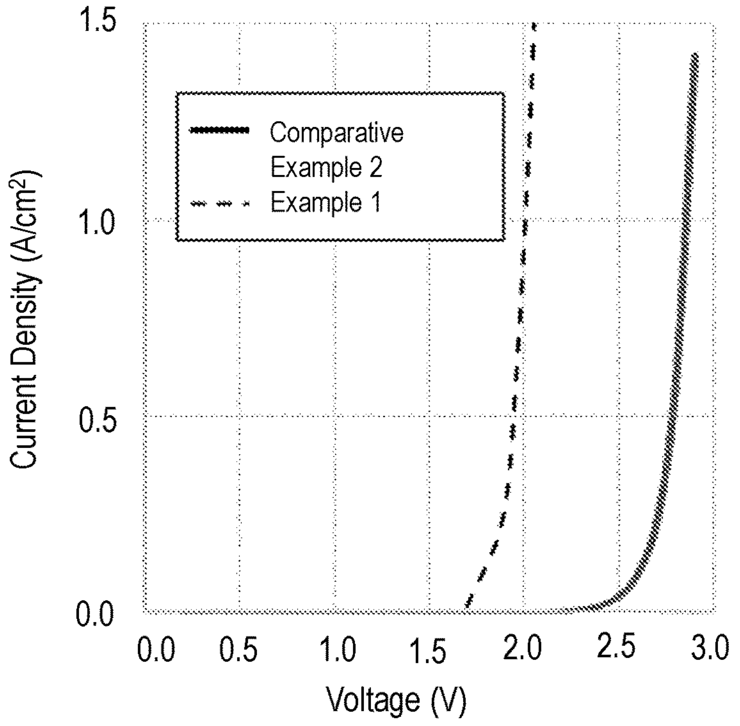
FIG. 2 is a graph showing the current density versus the voltage of an LED device.

FIG. 2 is a graph illustrating the current density of the LED of Example 1 compared to the LED of Comparative Example 2. The comparative InGaN LED operates at a current density of 1.2 A/cm$^2$ with a peak wavelength and spectrum FWHM of about 620 nm and 50 nm, respectively. The forward voltage of the comparative LED was high (about 2.8V at 1.2 A/cm$^2$). The color characteristics of the comparative LED are unacceptable when the current density is increased above 1.2 A/cm$^2$. Referring to FIG. 2, the LED of Example 1 results in improved current-voltage properties.

Figure 3:
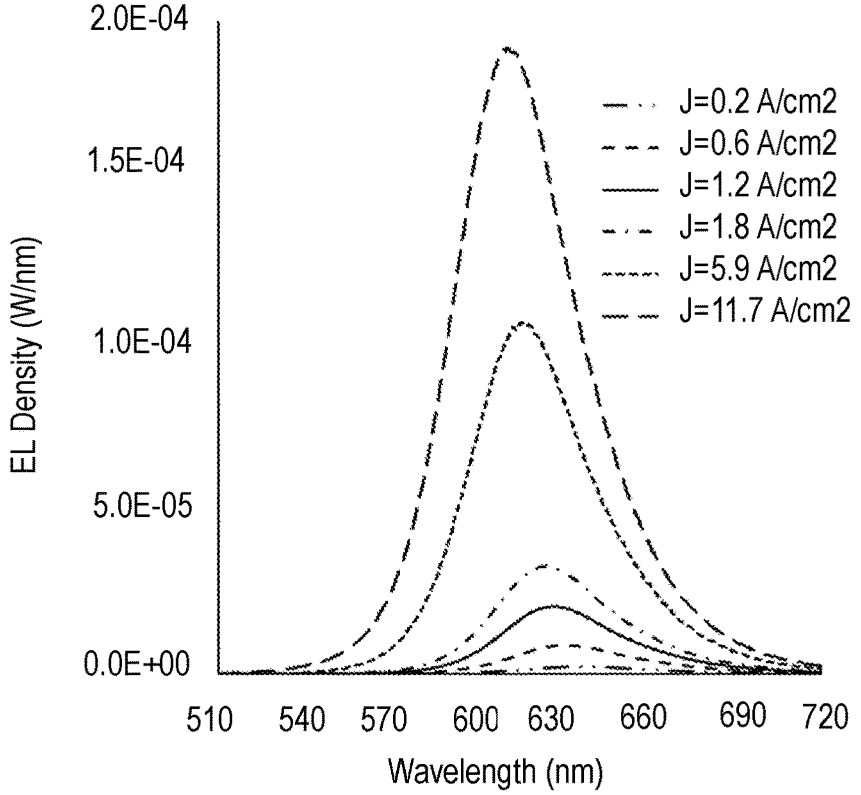
FIG. 3 is a graph showing the spectral characteristics of an LED device according to one or more embodiments.

FIG. 3 is a graph illustrating the spectral characteristic of the LED of Example 1. The peak wavelength remains longer than 610 nm at a current density of 10 A/cm$^2$.

Example 3

An LED having an indium gallium nitride (InGaN) well and a barrier layer was prepared. The indium gallium nitride (InGaN) well had an indium concentration greater than 18% mole fraction. The device had 10 superlattice pairs. The device had a dominant wavelength greater than 605 nm at a current density of greater than or equal to 2 A/cm$^2$.

Example 4

An LED having an indium gallium nitride (InGaN) well and a barrier layer was prepared. The indium gallium nitride (InGaN) well had an indium concentration greater than 18% mole fraction. The device had 40 superlattice pairs. The device had a dominant wavelength greater than 605 nm at a current density of greater than or equal to 6 A/cm$^2$.

Example 5

An LED having an indium gallium nitride (InGaN) well and a barrier layer was prepared. The indium gallium nitride (InGaN) well had an indium concentration greater than 18% mole fraction. The device had 50 superlattice pairs. The device had a dominant wavelength greater than 605 nm at a current density of greater than or equal to 6 A/cm$^2$.

Figure 4:
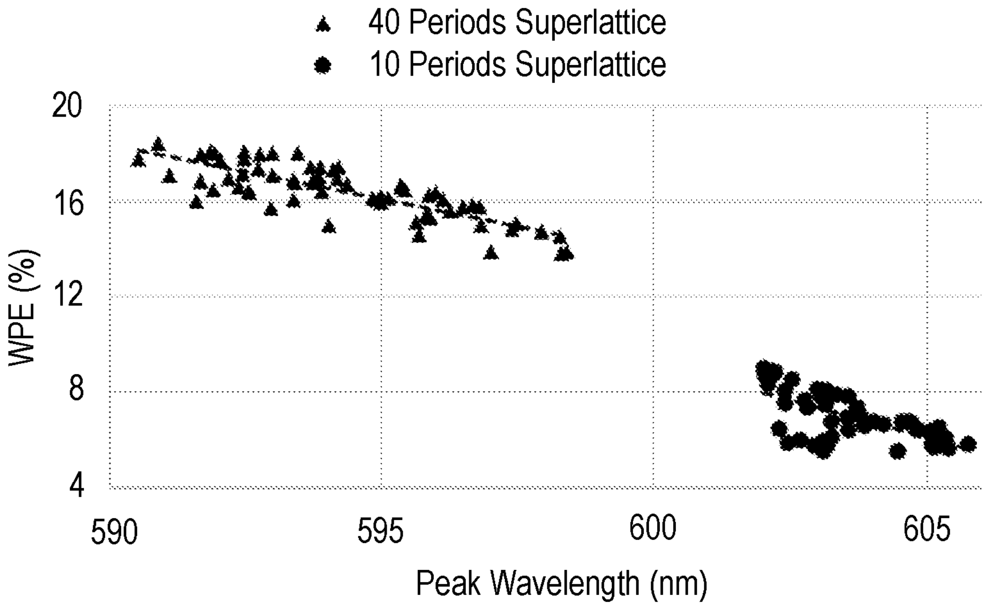
FIG. 4 is a graph showing the wall plug efficiency versus peak wavelength of an LED device according to one or more embodiments.
Figure 5:
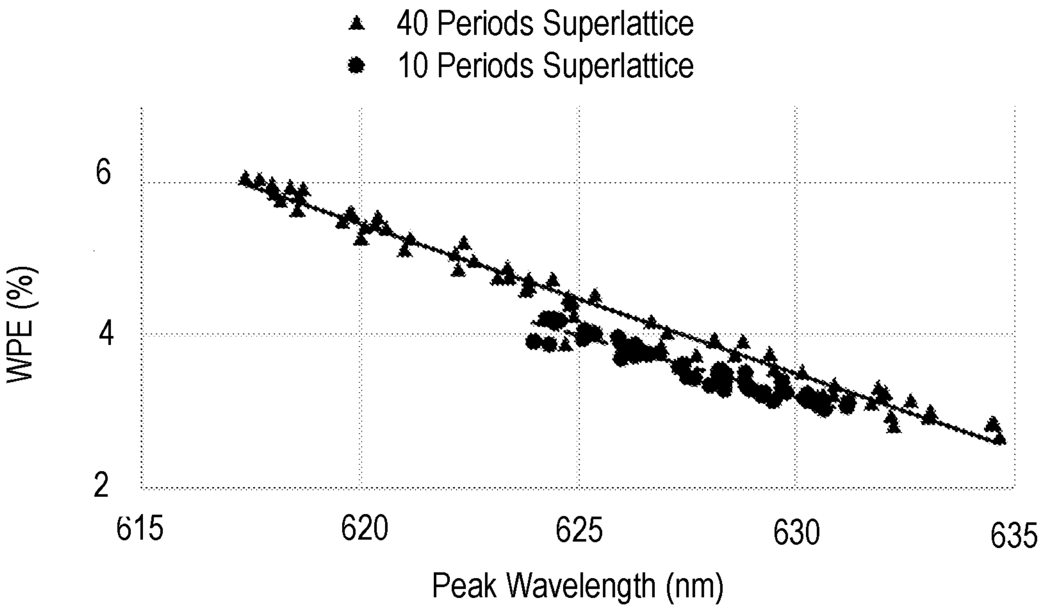
FIG. 5 is a graph showing the wall plug efficiency versus peak wavelength of an LED device according to one or more embodiments.

A key to obtaining LEDs with longer red wavelengths and high wall-plug efficiency (WPE) is the growth of a superlattice with multiple pairs of GaN and lower % In composition InGaN before the growth of the high % In composition active region. FIG. 4 illustrates a comparison of WPE for two epitaxy variations with 10 (Example 3) and 40 (Example 4) superlattice pairs and other parameters kept the same. It is noted that WPE increases with 40 superlattice pairs. It is also noted that the tendency for WPE to decrease as the wavelength is made longer (by increasing % In in the light emitting QWs) is weaker for the epitaxy with 40 superlattice pairs. These benefits are thought to be related to an increase of the in-plane lattice constant with the growth of more superlattice pairs, resulting in lower strain in the red-emitting QWs grown after 40 pairs vs. 10 pairs. It was found, however, that the benefit of increasing the number of pairs does not continue indefinitely, and, referring to FIG. 5, there is no further WPE improvement with 50 superlattice pairs (Example 5).

Example 6

An LED having an indium gallium nitride (InGaN) well and a barrier layer was prepared. The indium gallium nitride (InGaN) well had an indium concentration greater than 18% mole fraction. The device had 40 superlattice pairs. The device had a dominant wavelength greater than 605 nm at a current density of greater than or equal to 2 A/cm$^2$.

Example 7

An LED having an indium gallium nitride (InGaN) well and a barrier layer was prepared. The indium gallium nitride (InGaN) well had an indium concentration greater than 18% mole fraction. The device had 50 superlattice pairs. The device had a dominant wavelength greater than 605 nm at a current density of greater than or equal to 2 A/cm$^2$.

Figure 6:
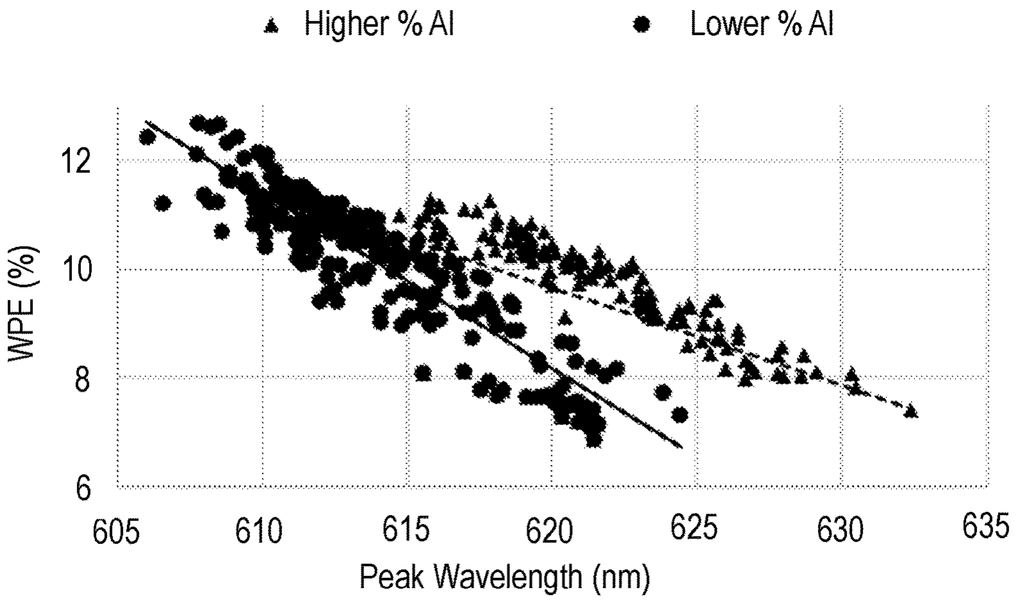
FIG. 6 is a graph showing the wall plug efficiency versus peak wavelength of an LED device according to one or more embodiments.

A second key to obtaining LEDs with longer red wavelengths and high WPE is to optimize the design of the quantum barriers. The best performance was found for a barrier design with an AlGaN layer grown directly on the InGaN QW and a GaN layer that did not contain Al grown directly under the InGaN QW. As shown in FIG. 6, the WPE increases and the tendency for WPE to decrease as the wavelength is made longer is weaker for the epitaxy with higher % Al in the AlGaN layer of the barrier. The high % Al content layer shifts the wavelength longer for a given QW indium concentration, allowing a redder color with less indium vs. the otherwise equivalent design having no AlGaN layer or an AlGaN layer of lower % Al. This mechanism is believed to explain the reduced tendency for WPE to decrease at longer wavelength target when the high % Al AlGaN layer is included in the structure.

Example 8

An LED having three indium gallium nitride (InGaN) wells and a barrier layer was prepared. The indium gallium nitride (InGaN) well had an indium concentration greater than 18% mole fraction. The device had 40 superlattice pairs. The device had a dominant wavelength greater than 605 nm at a current density of greater than or equal to 2 A/cm$^2$.

Figure 7:
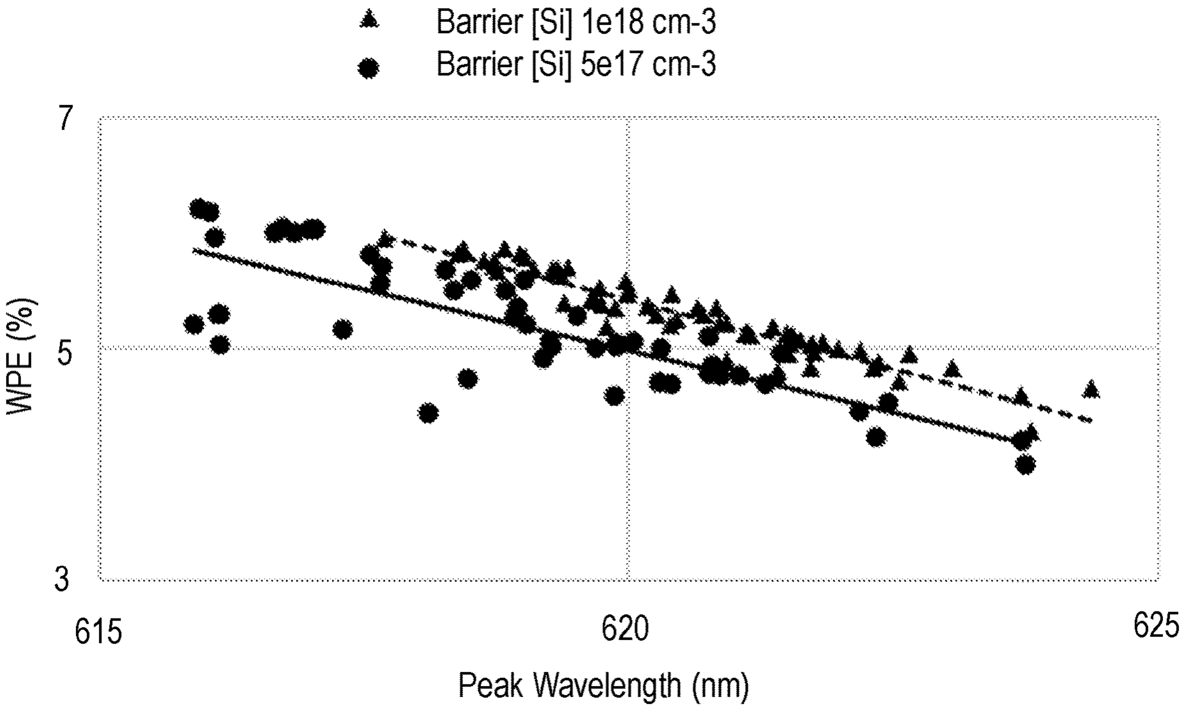
FIG. 7 is a graph showing the wall plug efficiency versus peak wavelength of an LED device according to one or more embodiments.

When the number of quantum wells is increased to three or decreased to one, it makes only a minor difference in WPE. Without intending to be bound by theory, it is believed that all or most of the red light emission is generated in the well closet to the p-GaN contact layer. Also, while the optimized epitaxy design uses silicon doping in the barrier layers it is found that large changes can be made to the silicon concentration with at most a minor effect on WPE. For example, as shown in FIG. 7, when the barrier silicon concentration is reduced by a factor of 2 it hardly makes a significant difference in the resulting WPE.

Example 9

An LED having an indium gallium nitride (InGaN) well and a barrier layer was prepared. The indium gallium nitride (InGaN) well had an indium concentration greater than 18% mole fraction. The device had 40 superlattice pairs. The device had a dominant wavelength greater than 605 nm at a current density of greater than or equal to 2 A/cm$^2$.

Figure 8:
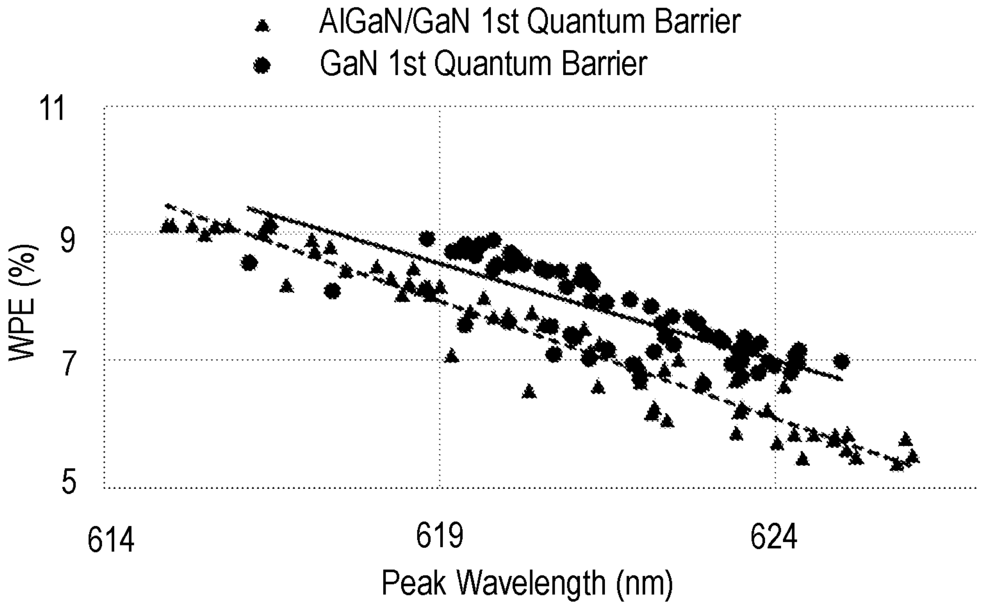
FIG. 8 is a graph showing the wall plug efficiency versus peak wavelength of an LED device according to one or more embodiments.

The design of the barrier layer under the first QW is another example of a parameter that may be changed without a large impact on WPE. As shown in FIG. 8, although a higher WPE is obtained when an aluminum-free GaN layer is used for the first quantum barrier, the difference in WPE between this design and an alternative one that incorporates aluminum into the first quantum barrier is fairly minor.

Example 10

An LED having an indium gallium nitride (InGaN) well and a barrier layer was prepared. The indium gallium nitride (InGaN) well had an indium concentration greater than 20% mole fraction. The device had a dominant wavelength of 612 nm at a current density of 1.2 A/cm$^2$ and maintained a dominant wavelength greater than 605 nm at a current density of greater than or equal to 2 A/cm$^2$.

Figure 9:
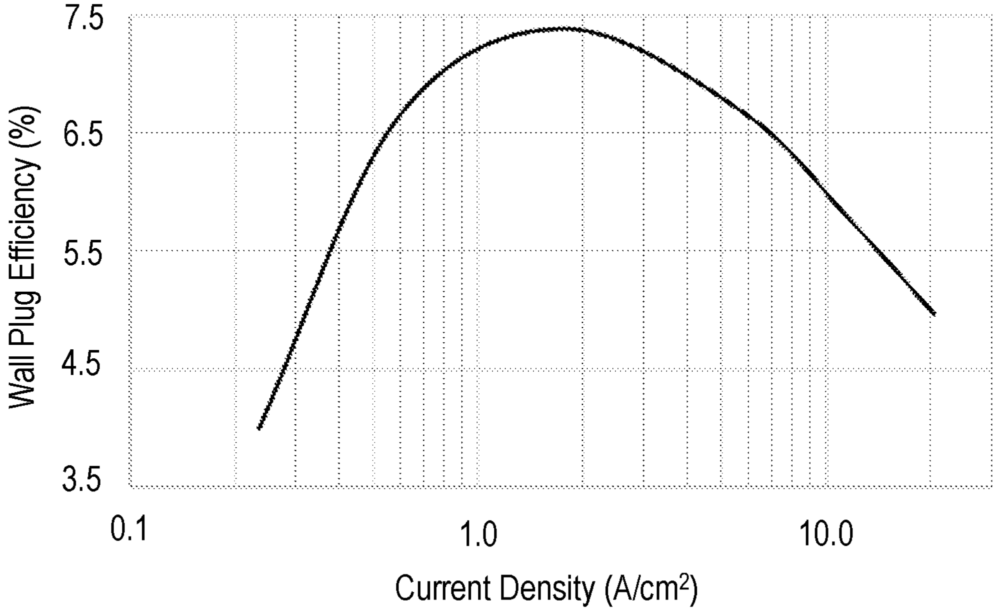
FIG. 9 is a graph showing the wall plug efficiency versus current density of an LED device according to one or more embodiments.

FIG. 9 is a graph illustrating the wall-plug efficiency of the LED of Example 10 as a function of operating current density.

Figure 10:
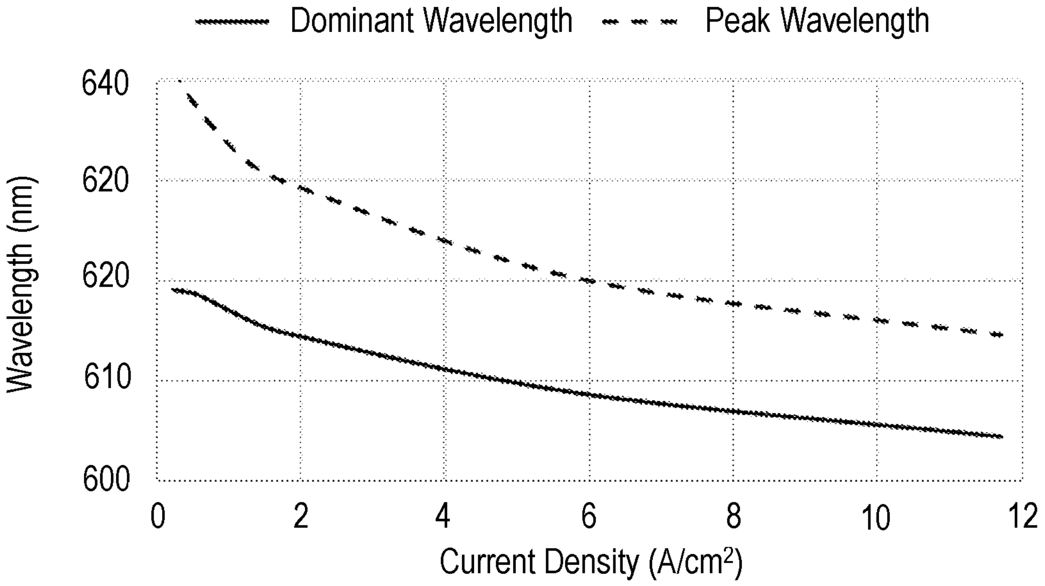
FIG. 10 is a graph showing the peak and dominant wavelength versus the current density for an LED device according to one or more embodiments.

FIG. 10 is a graph illustrating the peak and dominant wavelength versus the current density for the LED of Example 10.

EMBODIMENTS

Various embodiments are listed below. It will be understood that the embodiments listed below may be combined with all aspects and other embodiments in accordance with the scope of the invention.

Embodiment (a). A light emitting diode (LED) device comprising: a quantum well comprising an indium gallium nitride (InGaN) well and a barrier layer, the indium gallium nitride (InGaN) well having an indium concentration greater than 18% mole fraction, the device having a dominant wavelength greater than 605 nm at a current density of greater than or equal to 2 A/cm$^2$.

Embodiment (b). The LED device of embodiment (a), wherein the device has a dominant wavelength in a range of from greater than 605 nm to 630 nm at a current density in a range of from greater than 2 A/cm$^2$ to 100 A/cm$^2$.

Embodiment (c). The LED device of embodiments (a) to (b), wherein the device has a forward voltage less than 2.4 V at the current density of greater than or equal to 2 A/cm$^2$.

Embodiment (d). The LED device of embodiments (a) to (c), wherein the device has a wall-plug efficiency (WPE) greater than 3% at the current density greater than or equal to 2 A/cm$^2$.

Embodiment (e). The LED device of embodiments (a) to (d), wherein the device has a reverse leakage current less than 0.01 A/cm$^2$ at a bias of 15 V.

Embodiment (f). The LED device of embodiments (a) to (e), further comprising a superlattice structure on an n-type layer on a nucleation layer on a substrate, the superlattice structure comprising a first portion and a second portion of alternating pairs of an indium gallium nitride (InGaN) layer and a gallium nitride (GaN) layer, the quantum well on the superlattice structure.

Embodiment (g). The LED device of embodiments (a) to (f), wherein the second portion has a second dopant concentration of less than $5\times10^{17}$ cm$^{-3}$ and an indium concentration of less than 15% mole fraction.

Embodiment (h). The LED device of embodiments (a) to (g), wherein the first portion has a first dopant concentration in a range of from $1\times10^{18}$ cm$^{-3}$ to $5\times10^{18}$ cm$^{-3}$ and an indium concentration of less than 10% mole fraction.

Embodiment (i). The LED device of embodiments (a) to (h), wherein the first dopant and the second dopant are independently selected from one or more of silicon (Si), germanium (Ge), tin (Sn), and oxygen (O).

Embodiment (j). The LED device of embodiments (a) to (i), wherein the barrier layer comprises a first layer and a second layer, the first layer and second layer independently selected from one or more of aluminum gallium nitride (AlGaN) and gallium nitride (GaN).

Embodiment (k). The LED device of embodiments (a) to (j), wherein the barrier layer is doped with a barrier dopant in a range of from $5\times10^{17}$ cm$^{-3}$ to $5\times10^{18}$ cm$^{-3}$, the barrier dopant selected from one or more of silicon (Si), germanium (Ge), tin (Sn), and oxygen (O).

Embodiment (l). The LED device of embodiments (a) to (k), further comprising a plurality of p-type layers on the quantum well.

Embodiment (m). The LED device of embodiments (a) to (l), wherein the plurality of p-type layers comprise one or more of an aluminum gallium nitride (AlGaN) layer and a gallium nitride layer (GaN).

Embodiment (n). A light emitting diode (LED) device comprising: a nucleation layer on a substrate; an n-type layer on the nucleation layer; a quantum well on the n-type layer, the quantum well comprising an indium gallium nitride (InGaN) well and a barrier layer, the indium gallium nitride (InGaN) well having an indium concentration greater than 18% mole fraction; and a plurality of p-type layers on the quantum well, the device having a dominant wavelength greater than 605 nm at a current density greater than or equal to 2 A/$cm^2$.

Embodiment (o). The LED device of embodiment (n), wherein the device has a forward voltage less than 2.4 V at the current density of greater than or equal to 2 A/$cm^2$.

Embodiment (p). The LED device of embodiments (n) to (o), wherein the device has a wall-plug efficiency (WPE) greater than 3% at the current density of greater than or equal to 2 A/$cm^2$.

Embodiment (q). The LED device of embodiments (n) to (p), wherein the device has a reverse leakage current less than 0.01 A/$cm^2$ at a bias of 15 V.

Embodiment (r). The LED device of embodiments (n) to (q), further comprising a superlattice structure between the n-type layer and the quantum well, the superlattice structure comprising a first portion and a second portion of alternating pairs of an indium gallium nitride (InGaN) layer and a gallium nitride (GaN) layer.

Embodiment (s). The LED device of embodiments (n) to (r), wherein the second portion has a second dopant concentration of less than $5\times10^{17}$ $cm^{-3}$ and an indium concentration of less than 15% mole fraction, and the first portion has a first dopant concentration in a range of from $1\times10^{18}$ $cm^{-3}$ to $5\times10^{18}$ $cm^{-3}$ and an indium concentration of less than 10% mole fraction.

Embodiment (t). The LED device of embodiments (n) to (s), wherein the barrier layer comprises a first layer and a second layer, the first layer and second layer independently selected from one or more of aluminum gallium nitride (AlGaN) and gallium nitride (GaN).

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to the terms first, second, third, etc. may be used herein to describe various elements, and these elements should not be limited by these terms. These terms may be used to distinguish one element from another.

Reference throughout this specification to a layer, region, or substrate as being "on" or extending "onto" another element, means that it may be directly on or extend directly onto the other element or intervening elements may also be present. When an element is referred to as being "directly on" or extending "directly onto" another element, there may be no intervening elements present. Furthermore, when an element is referred to as being "connected" or "coupled" to another element, it may be directly connected or coupled to the other element and/or connected or coupled to the other element via one or more intervening elements. When an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A red light emitting diode (LED) device comprising:

a quantum well on a superlattice structure, the quantum well comprising an indium gallium nitride (InGaN) well and a barrier layer, the indium gallium nitride (InGaN) well having an indium concentration greater than 18% mole fraction, the superlattice structure comprising a first portion and a second portion of from 5 to 70 alternating pairs of an indium gallium nitride (InGaN) layer and a gallium nitride (GaN) layer, wherein the red LED device emits red light the device having a dominant wavelength greater than 605 nm at a current density of greater than or equal to 2 A/$cm^2$.

2. The red LED device of claim 1, wherein the dominant wavelength of the red LED light is in a range of from greater than 605 nm to 630 nm at a current density in a range of from greater than 2 A/$cm^2$ to 100 A/$cm^2$.

3. The red LED device of claim 1, wherein the red LED device has a forward voltage less than 2.4 V at the current density of greater than or equal to 2 A/$cm^2$.

4. The red LED device of claim 1, wherein the red LED device has a wall-plug efficiency (WPE) greater than 3% at the current density greater than or equal to 2 A/$cm^2$.

5. The red LED device of claim 1, wherein the red LED device has a reverse leakage current less than 0.01 A/$cm^2$ at a bias of 15 V.

6. The red LED device of claim 1, further comprising an n-type layer on a nucleation layer on a substrate, the superlattice structure on the n-type layer.

7. The red LED device of claim 1, wherein the second portion has a second dopant concentration of less than $5\times10^{17}$ $cm^{-3}$ and an indium concentration of less than 15% mole fraction.

8. The red LED device of claim 7, wherein the first portion has a first dopant concentration in a range of from $1\times10^{18}$ $cm^{-3}$ to $5\times10^{18}$ $cm^{-3}$ and an indium concentration of less than 10% mole fraction.

9. The red LED device of claim 8, wherein the first dopant and the second dopant are independently selected from one or more of silicon (Si), germanium (Ge), tin (Sn), and oxygen (O).

10. The red LED device of claim 1, wherein the barrier layer comprises a first layer and a second layer, the first layer and second layer independently selected from one or more of aluminum gallium nitride (AlGaN) and gallium nitride (GaN).

11. The red LED device of claim 10, wherein the barrier layer is doped with a barrier dopant in a range of from $5\times10^{17}$ $cm^{-3}$ to $5\times10^{18}$ $cm^{-3}$, the barrier dopant selected from one or more of silicon (Si), germanium (Ge), tin (Sn), and oxygen (O).

12. The red LED device of claim 1, further comprising a plurality of p-type layers on the quantum well.

13. The red LED device of claim 12, wherein the plurality of p-type layers comprises one or more of an aluminum gallium nitride (AlGaN) layer and a gallium nitride layer (GaN).

14. A red light emitting diode (LED) device comprising:

a nucleation layer on a substrate;

an n-type layer on the nucleation layer;

a superlattice structure on the n-type layer, the superlattice structure comprising a first portion and a second portion of in a range of from 5 to 70 alternating pairs of an indium gallium nitride (InGaN) layer and a gallium nitride (GaN) layer;

a quantum well on the superlattice structure, the quantum well comprising an indium gallium nitride (InGaN) well and a barrier layer, the indium gallium nitride (InGaN) well having an indium concentration greater than 18% mole fraction and the barrier layer comprising a first layer and a second layer, the first layer and second layer independently selected from one or more of aluminum gallium nitride (AlGaN) and gallium nitride (GaN); and a plurality of p-type layers on the quantum well, the device having a dominant wavelength greater than 605 nm at a current density greater than or equal to 2 $A/cm^2$.

15. The red LED device of claim 14, wherein the red LED device has a forward voltage less than 2.4 V at the current density of greater than or equal to 2 $A/cm^2$.

16. The red LED device of claim 14, wherein the red LED device has a wall-plug efficiency (WPE) greater than 3% at the current density of greater than or equal to 2 $A/cm^2$.

17. The red LED device of claim 14, wherein the red LED device has a reverse leakage current less than 0.01 $A/cm^2$ at a bias of 15 V.

18. The red LED device of claim 14, wherein the second portion has a second dopant concentration of less than $5\times10^{17}$ $cm^{-3}$ and an indium concentration of less than 15% mole fraction, and the first portion has a first dopant concentration in a range of from $1\times10^{18}$ $cm^{-3}$ to $5\times10^{18}$ $cm^{-3}$ and an indium concentration of less than 10% mole fraction.

* * * * *